(12) United States Patent  
Maejima

(10) Patent No.: US 9,390,946 B2
(45) Date of Patent: Jul. 12, 2016

(54) CLEANING APPARATUS

(71) Applicant: DISCO CORPORATION, Tokyo (JP)

(72) Inventor: Makoto Maejima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/336,159

(22) Filed: Jul. 21, 2014

(65) Prior Publication Data

US 2015/0020853 A1    Jan. 22, 2015

(30) Foreign Application Priority Data

Jul. 22, 2013    (JP) .................................. 2013-151510

(51) Int. Cl.
| | | |
|---|---|---|
| H01L 21/683 | (2006.01) | |
| H01L 21/67 | (2006.01) | |
| H01L 21/687 | (2006.01) | |

(52) U.S. Cl.
CPC ...... *H01L 21/67051* (2013.01); *H01L 21/6838* (2013.01); *H01L 21/68792* (2013.01)

(58) Field of Classification Search
CPC .................................................. H01L 21/6838
See application file for complete search history.

(56) References Cited

U.S. PATENT DOCUMENTS

2005/0284362 A1*   12/2005   Kim ................. H01L 21/68735
                                                                118/52

FOREIGN PATENT DOCUMENTS

JP        2009-094247        4/2009

\* cited by examiner

*Primary Examiner* — Jason Ko

(74) *Attorney, Agent, or Firm* — Greer Burns & Crain, Ltd.

(57) ABSTRACT

A cleaning apparatus including a holding table for holding a plate-shaped workpiece, a cleaning nozzle for spraying a cleaning fluid to the plate-shaped workpiece, and a table cover for covering a circumference of the holding table. The table cover includes a top plate for covering an upper side of the holding table and a side plate for covering the circumference of the holding table. The table cover is provided with a netlike mesh sheet spaced from a lower surface of the top plate and another netlike mesh sheet spaced from an inner surface of the side plate.

10 Claims, 3 Drawing Sheets

CLEANING APPARATUS

BACKGROUND OF THE INVENTION

1. Field of the Invention

The present invention relates to a cleaning apparatus for cleaning a surface of a plate-shaped workpiece such as a semiconductor wafer.

2. Description of the Related Art

Conventionally known is a spinner type cleaning apparatus including a rotatable holding table for holding a wafer and a cleaning nozzle for spraying a cleaning fluid to the wafer held on the holding table being rotated (see Japanese Patent Laid-Open No. 2009-094247, for example). In the cleaning apparatus described in Japanese Patent Laid-Open No. 2009-094247, the cleaning nozzle is pivotally oscillated above the holding table in spraying the cleaning fluid from the cleaning nozzle to the wafer, thereby cleaning off soil sticking to the whole surface of the wafer. Since the cleaning fluid is sprayed to the wafer being rotated, the cleaning fluid on the wafer is scattered by a centrifugal force. To cope with this scattering of the cleaning fluid, a scatter prevention cover is vertically movably provided so as to surround the holding table, wherein the scatter prevention cover is raised in an operative condition of the cleaning apparatus to thereby prevent the scattering of the cleaning fluid.

SUMMARY OF THE INVENTION

A sponge is provided on an inner surface of the scatter prevention cover in the cleaning apparatus to absorb the cleaning fluid scattering from the holding table. Since the sponge has a three-dimensional network structure, the cleaning fluid can be easily absorbed by the sponge. However, the cleaning fluid absorbed by the sponge is hard to discharge. Accordingly, a rate of discharge of the cleaning fluid absorbed by the sponge is low, and when the sponge is saturated with the cleaning fluid, there arises a problem such that the cleaning fluid striking the sponge may become a mist, which may stick to a periphery of the wafer or the holding table.

It is therefore an object of the present invention to provide a cleaning apparatus which can effectively prevent the production of a mist with a simple configuration.

In accordance with an aspect of the present invention, there is provided a cleaning apparatus including a holding table for holding a plate-shaped workpiece; a motor for rotating the holding table; a cleaning nozzle for spraying a cleaning fluid to the plate-shaped workpiece held on the holding table; and a cover for absorbing the cleaning fluid sprayed from the cleaning nozzle and scattered from the holding table holding the plate-shaped workpiece and rotating at a predetermined speed. The cover includes a top plate having an opening for exposing an upper surface of the holding table and a side plate connected to the top plate so as to extend downward therefrom. The top plate is positioned above an upper surface of the plate-shaped workpiece held on the holding table. The side plate is provided with a netlike mesh sheet spaced from an inner surface of the side plate.

With this configuration, the cleaning fluid scattering from the holding table during cleaning does not collide with the side plate of the cover, but it is absorbed by the mesh sheet spaced from the inner surface of the side plate of the cover. Accordingly, there is no possibility that a mist may be produced by a collision of the cleaning fluid with the side plate. Further, when the cleaning fluid is absorbed by the mesh sheet, the cleaning fluid retained in the mesh sheet is allowed to flow downward along the mesh sheet. Since the cleaning fluid absorbed by the mesh sheet is allowed to continuously fall downward along the mesh sheet, the mesh sheet is not saturated with the cleaning fluid, but it can be always maintained in a cleaning fluid absorbable condition. Accordingly, there is no possibility that the cleaning fluid colliding the mesh sheet may become a mist.

According to the present invention, the production of a mist can be effectively prevented by the simple configuration that the mesh sheet is provided inside the side plate of the cover.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
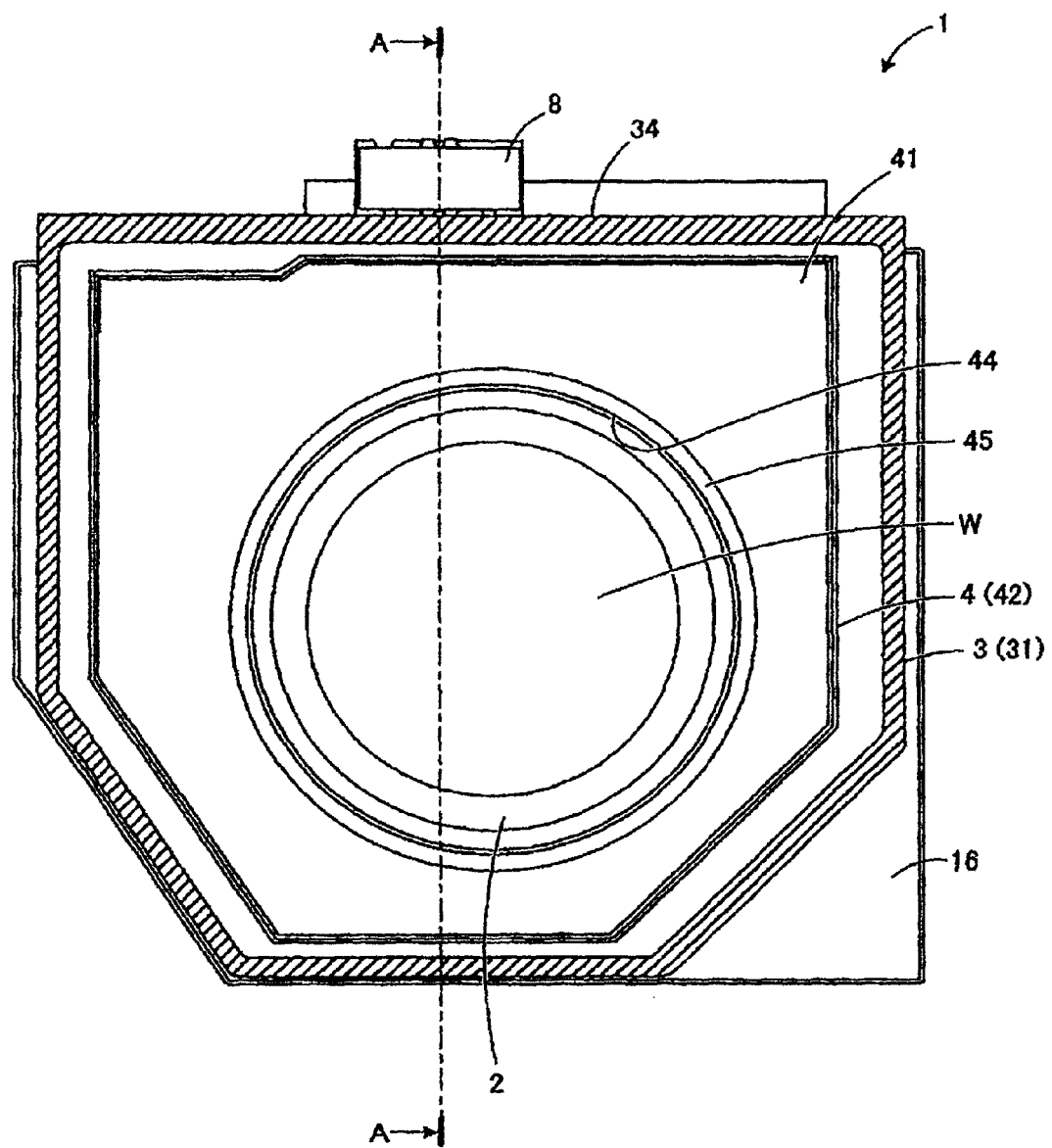
FIG. 1 is a schematic top plan view of a cleaning apparatus according to a preferred embodiment of the present invention.
Figure 2:
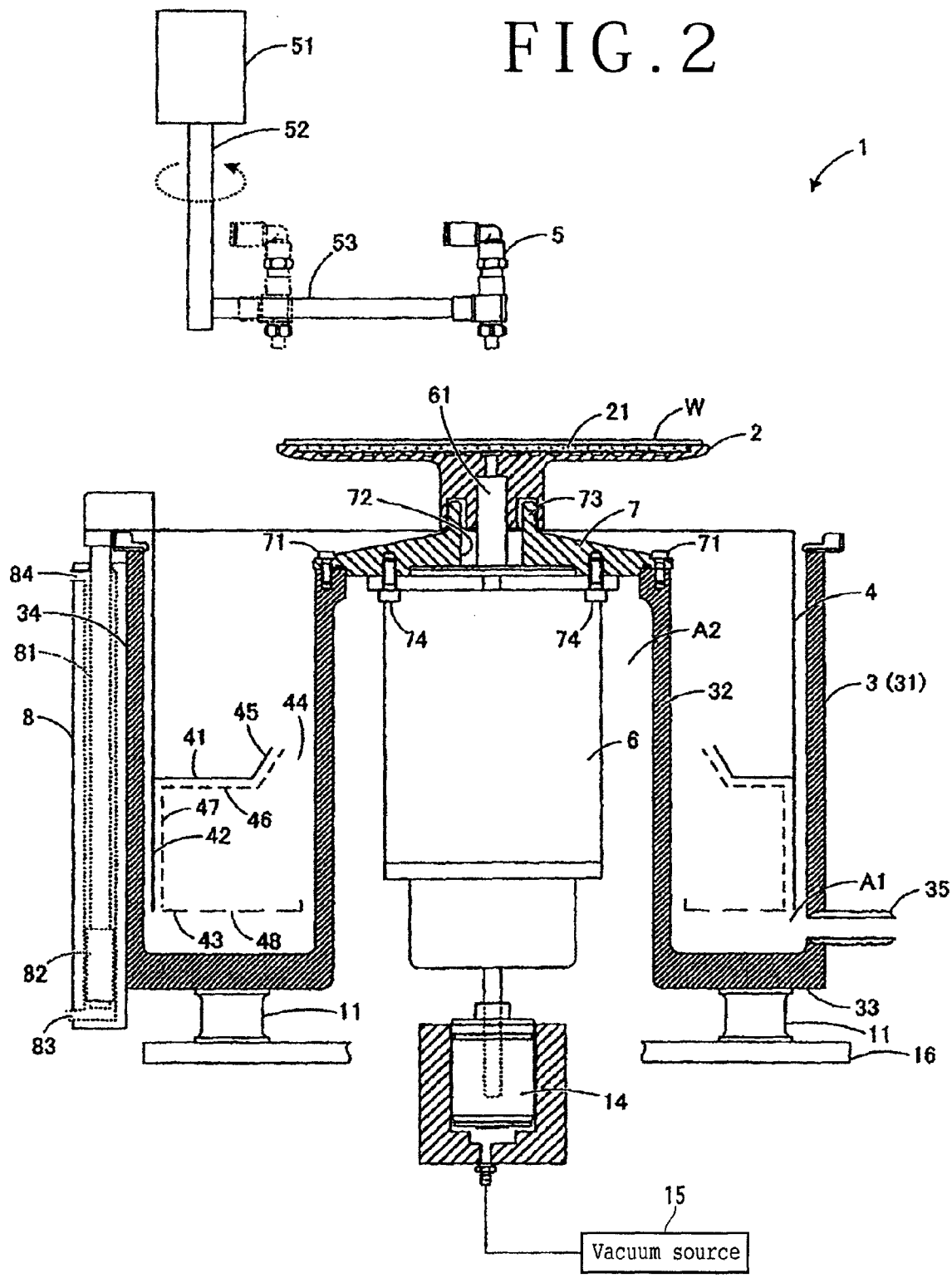
FIG. 2 is a schematic sectional view of the cleaning apparatus as taken along a line A-A in FIG. 1.

A preferred embodiment of the present invention will now be described in detail with reference to the attached drawings. FIG. 1 is a schematic top plan view of a cleaning apparatus 1 according to this preferred embodiment. FIG. 2 is a schematic sectional view of the cleaning apparatus 1 as taken along a line A-A in FIG. 1. A configuration of the cleaning apparatus 1 shown in FIG. 1 is merely illustrative and it may be suitably modified. In FIG. 1, a cleaning nozzle is not shown for convenience of illustration.

As shown in FIGS. 1 and 2, the cleaning apparatus 1 includes a holding table 2 for holding a plate-shaped workpiece W, a motor 6 for rotating the holding table 2, and a cleaning nozzle 5 for spraying a cleaning fluid to the plate-shaped workpiece W held on the holding table 2 during rotation of the holding table 2. The cleaning apparatus 1 is used for cleaning of the plate-shaped workpiece W after performing various kinds of processing such as grinding, polishing, edge trimming, and partial grinding except a peripheral portion of the workpiece W. The plate-shaped workpiece W may be a semiconductor wafer of silicon, gallium arsenide, etc. or may be an inorganic material substrate of ceramic, glass, sapphire ($Al_2O_3$), etc.

The cleaning apparatus 1 further includes a case 3 provided below the holding table 2 and a table cover 4 (cover) vertically movably provided in the case 3 so as to surround the holding table 2. The case 3 is composed of an outer wall portion 31 for surrounding an outer side surface of the table cover 4, an inner wall portion 32 located inside the table cover 4, and a bottom wall portion 33 connecting the outer wall portion 31 and the inner wall portion 32 at their lower ends. Accordingly, an annular space A1 is defined by the outer wall portion 31, the inner wall portion 32, and the bottom wall portion 33. This annular space A1 is open to an upper side so that the cleaning fluid scattering from the holding table 2 during cleaning is allowed to flow into the annular space A1. The annular space A1 functions also as a storing space for storing the table cover 4 in an inoperative condition of the cleaning apparatus 1. The bottom wall portion 33 of the case 3 is fixed through a plurality of rubber cushions 11 to a base 16.

The inner wall portion 32 of the case 3 has a cylindrical shape, and an inside space of the inner wall portion 32 is used as an installation space A2 for the motor 6 for rotationally driving the holding table 2. An upper opening of the installation space A2 for the motor 6 is closed by an upper lid 7. The upper lid 7 is fixed to an upper end of the inner wall portion 32 by a plurality of bolts 71. The upper lid 7 has a substantially frustoconical shape having a slightly inclined conical surface. The upper lid 7 has a central hole 72 for insertion of a rotating shaft 61 of the motor 6. An upper end of the upper lid 7 is formed with an annular projection 73 projecting toward the holding table 2. The holding table 2 is rotatably supported to the annular projection 73 of the upper lid 7. The motor 6 is fixed to a back side (lower surface) of the upper lid 7 by a plurality of bolts 74.

The motor 6 is mounted on the upper lid 7 so as to depend therefrom. The rotating shaft 61 of the motor 6 projects upward from the upper end of the motor 6 so as to be inserted through the central hole 72 of the upper lid 7. The upper portion of the rotating shaft 61 projects from the central hole 72 and is mounted to a lower portion of the holding table 2, thereby transmitting a torque of the motor 6 to the holding table 2. Further, the rotating shaft 61 of the motor 6 is formed with a suction passage (not shown), which is connected through a seal member 14 to a vacuum source 15. The seal member 14 is provided by a magnetic seal, for example. The seal member 14 functions to rotatably support the rotating shaft 61 and connect the suction passage formed in the rotating shaft 61 to the vacuum source 15. A holding member 21 of porous ceramic material is formed on an upper surface of the holding table 2. A vacuum is produced on the holding member 21 by the vacuum source 15 to thereby hold the plate-shaped workpiece W on the holding member 21 under suction.

The outer wall portion 31 of the case 3 has a polygonal prismatic shape. The outer wall portion 31 has an outer side surface 34 on which a cylinder 8 for vertically moving the table cover 4 is mounted. The cylinder 8 contains a rod 81. An upper end of the rod 81 projects from the cylinder 8 and is fixed to the table cover 4. The rod 81 is provided with a piston 82 separating inside space of the cylinder 8 into an upper space and a lower space. A communication hole 83 for introducing air into the lower space below the piston 82 is formed at a lower end portion of the cylinder 8. Similarly, a communication hole 84 for introducing air into the upper space above the piston 82 is formed at an upper end portion of the cylinder 8. By passing air through the communication holes 83 and 84, the table cover 4 is vertically moved through the rod 81.

The table cover 4 has a boxlike shape, and it includes a top plate 41 for covering an upper side of the holding table 2 in a raised position of the table cover 4 (see FIGS. 3A and 3B), a side plate 42 extending downward from an outer circumference of the top plate 41, and a bottom plate 43 connected to a lower end of the side plate 42 for covering a lower side of the holding table 2 in the raised position. The top plate 41 is higher in level than an upper surface of the plate-shaped workpiece W held on the holding table 2 in the raised position of the table cover 4. The top plate 41 has an opening 44 for allowing the holding table 2 to open to the upper side thereof. The opening 44 is formed by an opening projection 45 formed at a central portion of the top plate 41 so as to project obliquely upward toward the holding table 2. With this configuration of the top plate 41, the cleaning fluid scattering from the holding table 2 during cleaning is guided downward.

The top plate 41 is provided with a netlike mesh sheet 46 spaced from a whole lower surface of the top plate 41. The mesh sheet 46 functions to absorb a cleaning fluid scattering from the holding table 2 and a mist floating from an under side of the holding table 2. A space between the mesh sheet 46 and the lower surface of the top plate 41 is set to a sufficient space, so that there is no possibility that the cleaning fluid may be retained in the space between the mesh sheet 46 and the lower surface of the top plate 41. Accordingly, the cleaning fluid absorbed by the mesh sheet 46 is not retained in the mesh sheet 46, but quickly falls downward.

The side plate 42 has a polygonal prismatic shape similar to the shape of the outer wall portion 31 of the case 3. The side plate 42 is also provided with a netlike mesh sheet 47 spaced from a whole inner surface of the side plate 42. The mesh sheet 47 functions to absorb a cleaning fluid scattering from the holding table 2. As similar to the mesh sheet 46, a space between the mesh sheet 47 and the inner surface of the side plate 42 is set to a sufficient space, so that there is no possibility that the cleaning fluid may be retained in the space between the mesh sheet 47 and the inner surface of the side plate 42. Accordingly, the cleaning fluid absorbed by the mesh sheet 47 is not retained in the mesh sheet 47, but quickly falls downward.

The bottom plate 43 is located below the plate-shaped workpiece W held on the holding table 2. In the raised position of the table cover 4, the bottom plate 43 is positioned so as to cover the upper opening of the annular space A1 of the case 3. The bottom plate 43 of the table cover 4 is entirely formed with a plurality of holes 48 equally spaced from each other. The cleaning fluid absorbed by the mesh sheets 46 and 47 provided inside the top plate 41 and the side plate 42 is allowed to fall through the holes 48 of the bottom plate 43 into the annular space A1. Each of the mesh sheets 46 and 47 has a mesh size such that the cleaning fluid scattering from the holding table 2 is easily absorbed (caught) by the mesh sheets 46 and 47 and the cleaning fluid absorbed is quickly discharged from the mesh sheets 46 and 47.

Figure 3A:
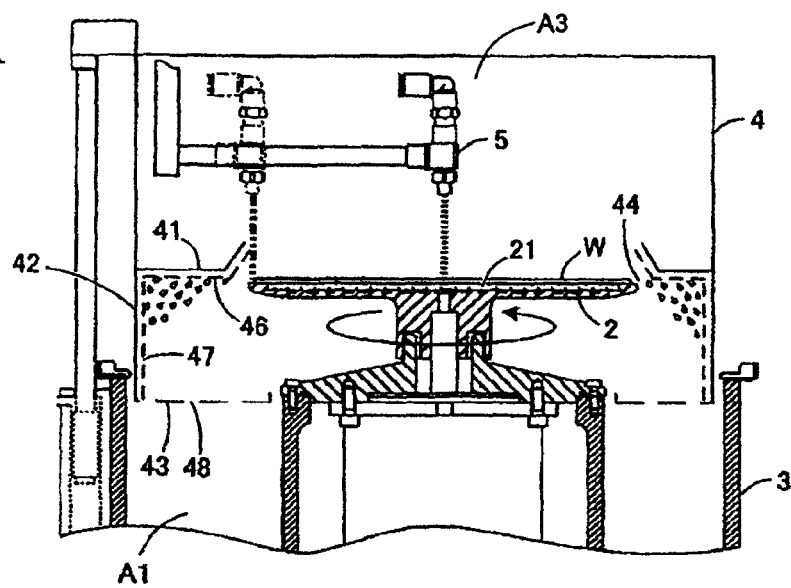
FIGS. 3A to 3C are views for illustrating a cleaning operation by the cleaning apparatus.
Figure 3B:
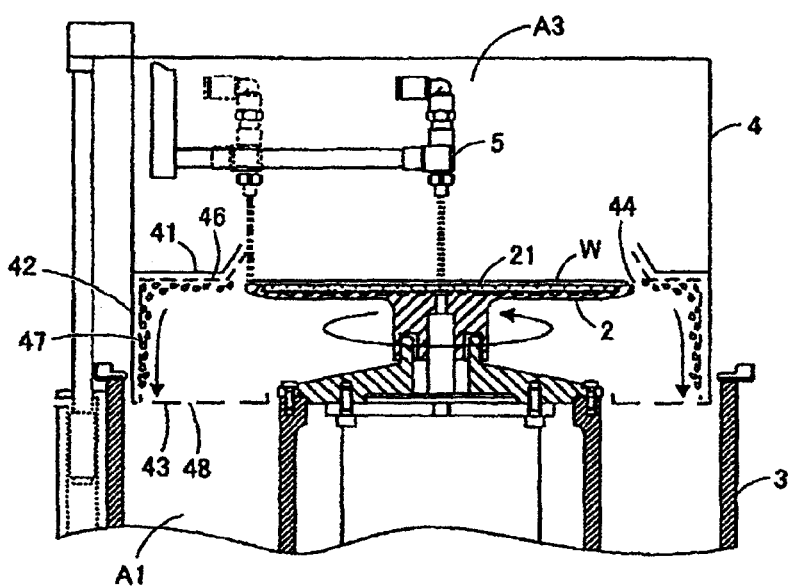

The rod 81 projecting from the cylinder 8 is fixed to an upper end portion of the outer side surface 34 of the side plate 42. In the inoperative condition of the cleaning apparatus 1, the table cover 4 is lowered so that the top plate 41, the side plate 42, and the bottom plate 43 are stored in the case 3 as shown in FIG. 2. In the operative condition of the cleaning apparatus 1, the table cover 4 is raised so that a circumference of the holding table 2 is surrounded by the top plate 41 and the side plate 42 and the lower portion of the holding table 2 is covered with the bottom plate 43 as shown in FIGS. 3A and 3B. Accordingly, in the inoperative condition of the cleaning apparatus 1, the holding table 2 is exposed from the table cover 4 as shown in FIG. 2, whereas in the operative condition of the cleaning apparatus 1, the holding table 2 is surrounded by the holding table 2 to define a cleaning chamber A3 as shown in FIGS. 3A and 3B.

The cleaning nozzle 5 for spraying a cleaning fluid to the plate-shaped workpiece W is located above the holding table 2. The cleaning nozzle 5 is supported through an arm 53 to a rotating shaft 52 of a cleaning nozzle moving motor 51. The cleaning nozzle 5 is adapted to rotate about an axis of the rotating shaft 52 by operating the cleaning nozzle moving motor 51 in such a manner that the cleaning nozzle 5 is oscillated between the center of the plate-shaped workpiece W and the outer circumference thereof. That is, the cleaning nozzle 5 operates to spray the cleaning fluid to the plate-shaped workpiece W held on the holding table 2 being rotated in the condition where the cleaning nozzle 5 is oscillated by the cleaning nozzle moving motor 51. Accordingly, the cleaning fluid is sprayed onto the whole upper surface of the plate-shaped workpiece W to thereby clean off any soil sticking to the upper surface of the plate-shaped workpiece W.

In the cleaning apparatus 1 described above, the cleaning fluid scattering from the holding table 2 during cleaning of the plate-shaped workpiece W is absorbed by the mesh sheets 46 and 47 located inside the top plate 41 and the side plate 42 of the table cover 4. That is, the cleaning fluid is absorbed by the mesh sheets 46 and 47 before reaching the side plate 42 and the top plate 41, so that there is no possibility that the cleaning fluid may collide with the top plate 41 and the side plate 42 to produce a mist. Furthermore, the cleaning fluid absorbed by the mesh sheets 46 and 47 is allowed to continuously flow along the mesh sheets 46 and 47 and next fall down through the holes 48 of the bottom plate 43 into the annular space A1. Accordingly, the mesh sheets 46 and 47 are not saturated with the cleaning fluid absorbed, but can be always maintained in a cleaning fluid absorbable condition. As a result, even when the cleaning fluid scattering from the holding table 2 collides with the mesh sheets 46 and 47, the cleaning fluid can be absorbed by the mesh sheets 46 and 47 without the production of a mist, so that an amount of a mist in the cleaning chamber A3 can be suppressed.

Figure 3C:
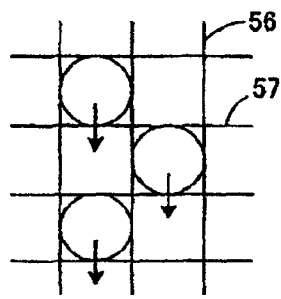

The cleaning operation by the cleaning apparatus 1 according to this preferred embodiment will now be described with reference to FIGS. 3A to 3C. FIGS. 3A to 3C are views for illustrating the cleaning operation by the cleaning apparatus 1. The cleaning operation shown in FIGS. 3A to 3C is merely illustrative and it may be suitably modified.

As shown in FIG. 3A, the plate-shaped workpiece W is held under suction on the holding member 21 of the holding table 2, and the table cover 4 is raised. Accordingly, the holding table 2 is surrounded by the table cover 4 to thereby define the cleaning chamber A3. At this time, the top plate 41 of the table cover 4 is positioned above the upper surface of the plate-shaped workpiece W held on the holding table 2, and the bottom plate 43 of the table cover 4 is positioned below the holding table 2 so as to cover the annular space A1. In this raised position of the table cover 4, the cleaning nozzle 5 is positioned inside the opening 44 of the top plate 41, and the holding table 2 holding the plate-shaped workpiece W is rotated. In this condition, the cleaning fluid is sprayed from the cleaning nozzle 5 to the plate-shaped workpiece W.

The cleaning fluid sprayed onto the plate-shaped workpiece W is scattered from the holding table 2 by a centrifugal force. At this time, the cleaning fluid scattering from the holding table 2 is absorbed by the mesh sheets 46 and 47 located inside the top plate 41 and the side plate 42. As described above, the mesh sheet 46 is sufficiently spaced from the lower surface of the top plate 41, and the mesh sheet 47 is sufficiently spaced from the inner surface of the side plate 42. Accordingly, the cleaning fluid absorbed by the mesh sheets 46 and 47 is easily discharged therefrom without an effect of a surface tension between the mesh sheet 46 and the lower surface of the top plate 41 and between the mesh sheet 47 and the inner surface of the side plate 42.

As shown in FIG. 3B, the cleaning fluid absorbed by the mesh sheets 46 and 47 is allowed to continuously flow along the mesh sheets 46 and 47 and next fall down through the holes 48 of the bottom plate 43 into the annular space A1. As shown in FIG. 3C, each of the mesh sheets 46 and 47 is composed of innumerable vertical threads 56 and innumerable horizontal threads 57 to form a lattice-like network with innumerable meshes. Such a two-dimensional network can retain the cleaning fluid. This two-dimensional network has a retention force for the cleaning fluid smaller than that of a three-dimensional network such as a sponge. Further, in the two-dimensional network, the cleaning fluid is allowed to straight flow down on a plane. Accordingly, a discharge path of the cleaning fluid in the two-dimensional network is simpler than that in the three-dimensional network. As a result, the cleaning fluid once absorbed by the mesh sheets 46 and 47 can be discharged in a shorter time as compared with the case of using an absorbing member having a three-dimensional network structure such as a sponge.

The cleaning fluid absorbed by the mesh sheets 46 and 47 is allowed to continuously flow down, so that the condition where the cleaning fluid has been absorbed by the mesh sheets 46 and 47 can be quickly returned to the condition where the cleaning fluid has been discharged from the mesh sheets 46 and 47. In this manner, the absorption and the discharge of the cleaning fluid are continuously repeated in the mesh sheets 46 and 47, so that the mesh sheets 46 and 47 are not saturated with the cleaning fluid. Accordingly, the cleaning fluid scattering from the holding table 2 can be continuously absorbed by the mesh sheets 46 and 47, so that even when the cleaning fluid collides with the mesh sheets 46 and 47, no mist is produced. Further, the cleaning fluid absorbed by the mesh sheets 46 and 47 does not become a mist, but falls down through the holes 48 of the bottom plate 43 into the annular space A1. Thereafter, the cleaning fluid is discharged from a drain outlet 35 (see FIG. 2) provided at a lower end portion of the outer wall portion 31 of the case 3. Accordingly, it is unnecessary to provide any forced draft equipment on the case 3. Thus, the production of a mist can be effectively suppressed by the simple configuration that the mesh sheets 46 and 47 are provided inside the top plate 41 and the side plate 42 of the table cover 4.

According to the cleaning apparatus 1 described above, the cleaning fluid scattering from the holding table 2 during cleaning does not collide with the top plate 41 and the side plate 42 of the table cover 4, but it is absorbed by the mesh sheets 46 and 47 provided inside the top plate 41 and the side plate 42 of the table cover 4. Accordingly, there is no possibility that a mist is produced due to the collision of the cleaning fluid with the top plate 41 and the side plate 42, thereby suppressing the production of a mist in the table cover 4. Further, when the cleaning fluid is absorbed by the mesh sheets 46 and 47, the cleaning fluid retained in the network of the mesh sheets 46 and 47 is allowed to flow down along the network. That is, the cleaning fluid absorbed by the mesh sheets 46 and 47 is allowed to continuously fall down along the network, so that the mesh sheets 46 and 47 are not saturated with the cleaning fluid, but they can be always maintained in a cleaning fluid absorbable condition. Accordingly, there is no possibility that the cleaning fluid colliding the mesh sheets 46 and 47 may become a mist.

The present invention is not limited to the above preferred embodiment, but various modifications may be made. The size, shape, etc. of any part shown in the attached drawings are merely illustrative and they may be suitably changed within the scope where the effect of the present invention can be exhibited. Further, the above preferred embodiment may be suitably modified without departing from the scope of the object of the present invention.

For example, while the cleaning nozzle 5 in the cleaning apparatus 1 is pivotably oscillated so as to spray the cleaning fluid to the whole surface of the plate-shaped workpiece W in the above preferred embodiment, the present invention is not limited to this configuration provided that the cleaning fluid is sprayed to the plate-shaped workpiece W to thereby clean the workpiece W. For example, in the case that the plate-shaped workpiece W is a workpiece processed by edge trimming, the cleaning fluid may be sprayed to only the outer circumference of the plate-shaped workpiece W.

While the table cover 4 is vertically movable in the above preferred embodiment, the table cover 4 may be fixed at the raised position so as to always surround the holding table 2. Further, while the mesh sheets 46 and 47 are provided inside the top plate 41 and the side plate 42 of the table cover 4 in the above preferred embodiment, it is essential that at least the mesh sheet 46 is to be provided inside the side plate 42 of the table cover 4.

Further, while the bottom plate 43 is included in the table cover 4 in the above preferred embodiment, it is essential that at least the top plate 41 and the side plate 42 are to be included in the table cover 4. Also with such a configuration, the production of a mist can be effectively prevented. Further, while each of the mesh sheets 46 and 47 forms a lattice-like network in the above preferred embodiment, the shape of the network is not especially limited provided that each of the mesh sheets 46 and 47 has a two-dimensional network structure.

In the above preferred embodiment, the single mesh sheet 46 is provided inside the top plate 41 and the single mesh sheet 47 is provided inside the side plate 42. However, a plurality of mesh sheets 46 spaced a predetermined distance from each other may be provided inside the top plate 41. Similarly, a plurality of mesh sheets 47 spaced a predetermined distance from each other may be provided inside the side plate 42.

According to the present invention, the production of a mist can be effectively prevented by the simple configuration that the mesh sheet is provided inside the side plate of the cover. In particular, the present invention is useful as a cleaning apparatus for cleaning off any soil on a whole surface of a plate-shaped workpiece.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cleaning apparatus comprising:
    a holding table for holding a plate-shaped workpiece;
    a motor for rotating said holding table;
    a cleaning nozzle for spraying a cleaning fluid to said plate-shaped workpiece held on said holding table; and
    a cover for absorbing said cleaning fluid sprayed from said cleaning nozzle and scattered from said holding table holding said plate-shaped workpiece and rotating at a predetermined speed,
    said cover including a top plate having an opening for exposing an upper surface of said holding table and a side plate connected to said top plate so as to extend downward therefrom, said top plate being positioned above an upper surface of said plate-shaped workpiece held on said holding table,
    said side plate being provided with a netlike mesh sheet sufficiently spaced from an inner surface of said side plate such that cleaning fluid absorbed by the netlike mesh sheet is discharged downwardly therefrom without an effect of surface tension between the netlike mesh sheet and the inner surface of said side plate.

2. The cleaning apparatus according to claim 1, wherein said top plate is provided with another netlike mesh sheet spaced from a lower surface of said top plate.

3. The cleaning apparatus according to claim 1, wherein the entirety of said top plate is positioned above the upper surface of said plate-shaped workpiece held on said holding table.

4. The cleaning apparatus according to claim 1, wherein said top plate includes a first portion that extends in essentially the same direction as a holding surface of said holding table and a second portion that is formed at a central portion of said top plate and that extends in a direction that is oblique to said first portion.

5. The cleaning apparatus according to claim 4, wherein the an intersection between the first and second portions of the top plate is higher in level than the holding surface of said holding table.

6. The cleaning apparatus according to claim 2, wherein:
    said top plate includes a first portion that extends in essentially the same direction as a holding surface of said holding table and a second portion that is formed at a central portion of said top plate and that extends in a direction that is oblique to said first portion; and
    said second portion of said top plate also includes a netlike mesh sheet spaced from an inner surface of said second portion.

7. The cleaning apparatus according to claim 2, wherein the netlike mesh sheet provided with said side plate and the another netlike mesh sheet provided with said top plate are configured and arranged to direct the cleaning fluid downwardly without the use of forced draft equipment.

8. The cleaning apparatus according to claim 1,
    wherein said cover is configured and arranged to be vertically movable with respect to the holding table.

9. The cleaning apparatus according to claim 1, further comprising:
    a case provided below said holding table for defining an annular space, and
    wherein said annular space functions as a storing space for storing said cover in an inoperative condition of the cleaning apparatus.

10. The cleaning apparatus according to claim 1,
    wherein said motor has a rotating shaft for transmitting a torque of said motor to said holding table, and
    further wherein said rotating shaft is formed with a suction passage, which is connected through a seal member to a vacuum source.

* * * * *